United States Patent [19]
Inanami et al.

[11] Patent Number: 5,793,257
[45] Date of Patent: Aug. 11, 1998

[54] OSCILLATOR HAVING SWITCHING CAPACITORS AND PHASE-LOCKED LOOP EMPLOYING SAME

[75] Inventors: Noboru Inanami, Osaki; Yuji Segawa; Kunihiko Gotoh, both of Kawasaki, all of Japan

[73] Assignee: Fujitsu Limited, Kanagawa, Japan

[21] Appl. No.: 778,781

[22] Filed: Jan. 6, 1997

[30] Foreign Application Priority Data

Jun. 28, 1996 [JP] Japan .................. 8-169272

[51] Int. Cl.$^6$ ........................... H03L 7/00
[52] U.S. Cl. ............... 331/17; 331/25; 331/366; 331/108 R
[58] Field of Search ............... 331/17, 25, 34, 331/36 C, 107 R, 108 R, 111

[56] References Cited

U.S. PATENT DOCUMENTS 4,987,373  1/1991  Soo ............................ 331/25
5,663,675  9/1997  O'Shaughnessy ............ 331/111

Primary Examiner—David C. Nelms
Assistant Examiner—Trong Phan
Attorney, Agent, or Firm—Nikaido, Marmelstein, Murray & Oram LLP

[57] ABSTRACT

A voltage-controlled oscillator has first and second switched capacitor filters, an operational amplifier, and a comparator. The first switched capacitor filter is controlled by a control clock signal to supply a positive current depending on an input voltage, and the second switched capacitor filter is controlled by the control clock signal to supply a negative current depending on the input voltage. The operational amplifier has an input terminal alternately connectable to the first and second switched capacitor filters by a first switch which can be rendered conductive in synchronism with an output clock signal, and another input terminal for being supplied with a constant voltage. A potential at an output terminal of the operational amplifier is lowered when the operational amplifier is supplied with the positive current through a feedback circuit which is provided between the input terminal and the output terminal, and is increased when the operational amplifier is supplied with the negative current through the feedback circuit. The comparator compares the potential at the output terminal of the operational amplifier alternately with a first constant voltage and a second constant voltage, lower than the first constant voltage, which can be switched in synchronism with the output clock signal, thereby to produce the output clock signal.

12 Claims, 14 Drawing Sheets

SCF1 fCLK = L fCLK = H $$R2 = -\frac{1}{f_{CLK} \cdot C_1}$$

OSCILLATOR HAVING SWITCHING CAPACITORS AND PHASE-LOCKED LOOP EMPLOYING SAME

BACKGROUND OF THE INVENTION

1. Field of the Invention

The present invention relates to a voltage-controlled oscillator for generating a clock signal having a frequency proportional to an input voltage applied thereto, and a phase-locked loop (PLL) which incorporates such a voltage-controlled oscillator.

2. Description of the Prior Art

Phase-locked loops have seen widely usage as a circuit for generating an output signal synchronous with a received signal in various applications including digital display devices, radio communication devices, etc. The phase-locked loops usually have a phase comparator which compares the phase of an input signal with the phase of a comparison signal that has been produced by frequency-dividing an output signal by N, a voltage-controlled oscillator which and outputs a frequency proportional to a voltage depending on the phase difference or angle.

Conventional voltage-controlled oscillators generate a current depending on an input voltages, charge and discharge a capacitor between given voltages with the generated current, and output a clock signal in synchronism with the charging and discharging of the capacitor. The value of the current generated depending on the input voltage is determined from the input voltage and the value of a given resistor, and the speed of the charging and discharging of the capacitor is determined from the value of the current and the value of the capacitance of the capacitor. Therefore, the frequency of the clock signal is determined from the value of the current and the value of the capacitance of the capacitor.

The value of the resistor, which is fabricated within an LSI circuit, depends on the impurity concentration, the area, the depth, etc. of the resistor, and is subject to variations caused by the fabrication process. The capacitance of the capacitor is determined depending on the area of the capacitor, the thickness of a dielectric layer of the capacitor, the dielectric constant thereof, etc., and is also subject to variations due to the fabrication process. Consequently, the output frequency of the voltage-controlled oscillator also suffers variations due to the fabrication process, so that the voltage-controlled oscillator is unable to generate a clock signal having a frequency that is accurately controlled by the input voltage.

SUMMARY OF THE INVENTION

It is therefore an object of the present invention to provide a voltage-controlled oscillator capable of generating a clock signal having a frequency which is free of variations that would otherwise be caused by a fabrication process for the voltage-controlled oscillator.

Another object of the present invention is to provide a voltage-controlled oscillator which has switched capacitors to generate a clock signal having a frequency which is free of variations that would otherwise be caused by a fabrication process for the voltage-controlled oscillator.

Still another object of the present invention is to provide a phase-locked loop which incorporates the above voltage-controlled oscillator.

To achieve the above objects, there is provided in accordance with the present invention a voltage-controlled oscillator for generating an output clock signal having a frequency depending on the value of an input voltage applied thereto, comprising a first switched capacitor filter operatively connected to an input voltage terminal supplied with the input voltage, for switchingly operating in response to a control clock signal to supply a positive current depending on the input voltage, a second switched capacitor filter operatively connected to the input voltage terminal, for switchingly operating in response to the control clock signal to supply a negative current depending on the input voltage, an operational amplifier having an input terminal alternately connectable to the first switched capacitor filter and the second switched capacitor filter by a first switch which can be rendered conductive in synchronism with the output clock signal, and another input terminal for being supplied with a constant voltage, the arrangement being such that a potential at an output terminal of the operational amplifier is lowered when the operational amplifier is supplied with the positive current through a feedback circuit which is provided between the input terminal and the output terminal, and a potential at the output terminal is increased when the operational amplifier is supplied with the negative current through the feedback circuit, and a comparator for comparing a potential at the output terminal of the operational amplifier alternately with a first constant voltage and a second constant voltage which can be switched in synchronism with the output clock signal, the second constant voltage being lower than the first constant voltage, thereby to produce the output clock signal.

Since the equivalent resistance of each of the switched capacitor filters is represented by the reciprocal of the product of the capacitance thereof and the frequency of the control clock signal, the frequency of the output clock signal is free of variations due to the fabrication process.

The first switched capacitor filter may comprise a capacitor having an electrode connected to a constant-voltage terminal and another electrode connectable alternately to the input voltage terminal and the first switch through a second switch which is controlled by the control clock signal, and an equivalent resistor having a resistance depending on the reciprocal of the product of the capacitance of the capacitor and the frequency of the control clock signal.

Alternatively, the first switched capacitor filter may comprise a capacitor having an electrode connectable alternately to the input voltage terminal and a constant-voltage terminal through a third switch which is controlled by the control clock signal and another electrode connectable alternately to the first switch and the constant-voltage terminal through a fourth switch controlled in phase with the third switch by the control clock signal, and an equivalent resistor having a resistance depending on the reciprocal of the product of the capacitance of the capacitor and the frequency of the control clock signal.

The second switched capacitor filter may comprise a capacitor having an electrode connectable alternately to the input voltage terminal and a constant-voltage terminal through a fifth switch which is controlled by the control clock signal and another electrode connectable alternately to the first switch and the constant-voltage terminal through a sixth switch controlled in opposite phase with the fifth switch by the control clock signal, and an equivalent resistor having a resistance depending on the reciprocal of the product of the capacitance of the capacitor and the frequency of the control clock signal.

According to the present invention, there is also provided a voltage-controlled oscillator for generating an output clock signal having a frequency depending on the value of an input voltage applied thereto, comprising a voltage-to-current converter for generating a current depending on the input voltage which is supplied through an input voltage terminal, a chargeable/dischargeable capacitor for being charged and discharged in synchronism with the output clock signal by a current generated by the voltage-to-current converter, a comparator for comparing a voltage across the chargeable/dischargeable capacitor as it is charged and discharged alternately with a first constant voltage and a second constant voltage which can be switched in synchronism with the output clock signal, the second constant voltage being lower than the first constant voltage, thereby to produce the output clock signal, and an operational amplifier having an input resistor connected to an input terminal thereof and a feed back resistor provided between the input terminal and an output terminal thereof, the feed back resistor comprising a third switched capacitor filter switchingly controlled by the control clock signal.

There is also provided a phase-locked loop for generating an output signal in phase with an input signal, the output signal having a frequency which is a multiple of the frequency of the input signal, comprising a phase comparator for detecting a phase difference between the input signal and a comparison signal produced by dividing the frequency of the output signal by a predetermined number, a voltage-controlled oscillator described above for producing the output signal in response to an output voltage from the phase comparator, and a frequency divider for dividing the frequency of the output signal by the predetermined number.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
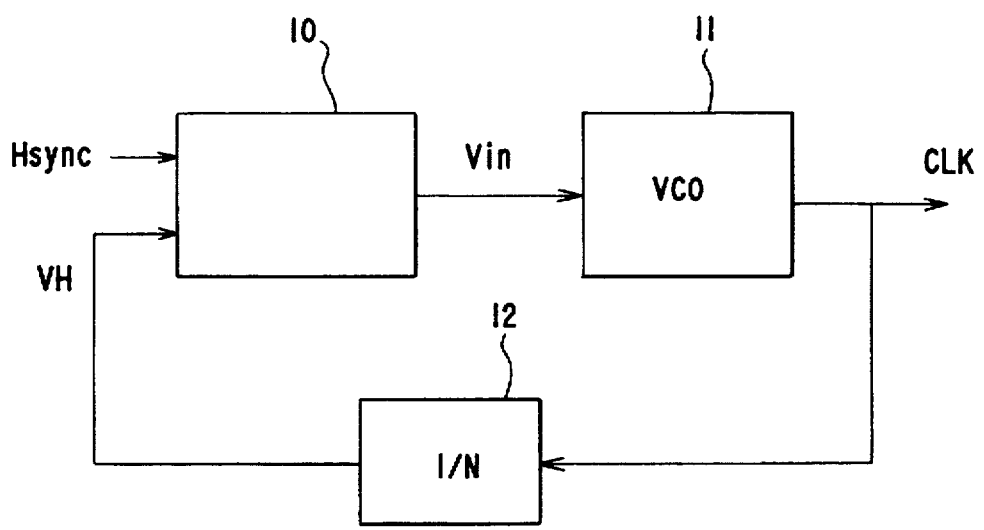
FIG. 1 is a block diagram of a general phase-locked loop.

FIG. 1 shows a general phase-locked loop in block form. As shown in FIG. 1, the phase-locked loop, which may be incorporated in a digital display device, for example, is supplied with a horizontal synchronizing signal Hsync at an input terminal thereof for generating a clock signal CLK in synchronism with the horizontal synchronizing signal Hsync, the clock signal CLK having a frequency which is N times the frequency of the horizontal synchronizing signal Hsync. The phase-locked loop has a phase comparator 10 for detecting a phase difference or angle between the horizontal synchronizing signal Hsyn and a comparison signal VH that has been produced by frequency-dividing the clock signal CLK by N, a voltage-controlled oscillator (VCO) 11 which is controlled by an input voltage Vin depending on the phase difference detected by the phase comparator 10, and a frequency divider 12 for dividing the frequency of the clock signal CLK by N. The voltage-controlled oscillator 11 generates the clock signal CLK which has a frequency depending on the value of the input voltage Vin. In operation, the phase-locked loop is locked in a state in which there is no phase difference between the horizontal synchronizing signal Hsyn and the comparison signal VH, i.e., an output signal from the frequency divider 12, outputting the clock signal CLK that is synchronous with the horizontal synchronizing signal Hsyn and has a frequency N times the frequency of the horizontal synchronizing signal Hsyn.

Figure 2:
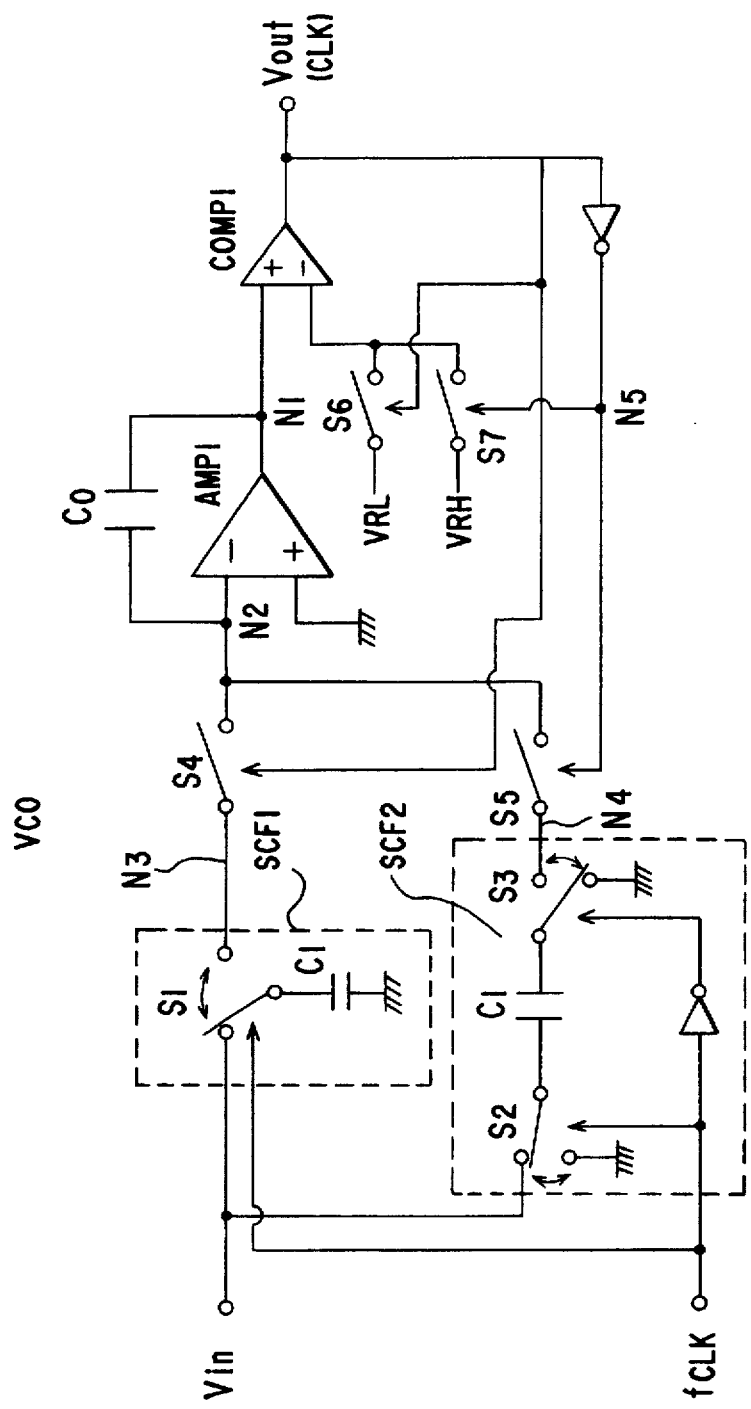
FIG. 2 is a circuit diagram of a voltage-controlled oscillator according to the present invention.

FIG. 2 shows a voltage-controlled oscillator according to the present invention which is designed to be free of variations that would otherwise be caused by a fabrication process for the voltage-controlled oscillator. The voltage-controlled oscillator shown in FIG. 2 has a first switched capacitor filter SCF1 having an equivalent positive resistance and a second switched capacitor filter SCF2 having an equivalent negative resistance. The first and second switched capacitor filters SCF1, SCF2 are connected respectively through switches S4, S5 to an inverting input terminal of an operational amplifier AMP1 through a node N2. The operational amplifier AMP1 has a non-inverting input terminal grounded. The switches S4, S5 are controlled to switch complementarily by an output signal Vout. The operational amplifier AMP1 has an output terminal connected through a node N1 to a positive input terminal of a comparator COMP1. The output terminal of the operational amplifier AMP1 is also connected through the node N1 to a capacitor C0, which is connected through the node N2 to the inverting input terminal of the operational amplifier AMP1. The comparator COMP1 has a negative input terminal which can be supplied with constant voltages VRH, VRL through respective switches S6, S7 that are controlled to switch complementarily by the output signal Vout. The constant voltage VRH is higher than the constant voltage VRL.

The first switched capacitor filter SCF1 comprises a switch S1 and a capacitor C1. The switch S1 is controlled as shown in FIG. 2 by a control clock signal $f_{CLK}$. The second switched capacitor filter SCF2 comprises switches S2, S3 and a capacitor C1. The switches S2, S3 are controlled by a signal complementary to the control clock signal $F_{CLK}$.

Figure 3:
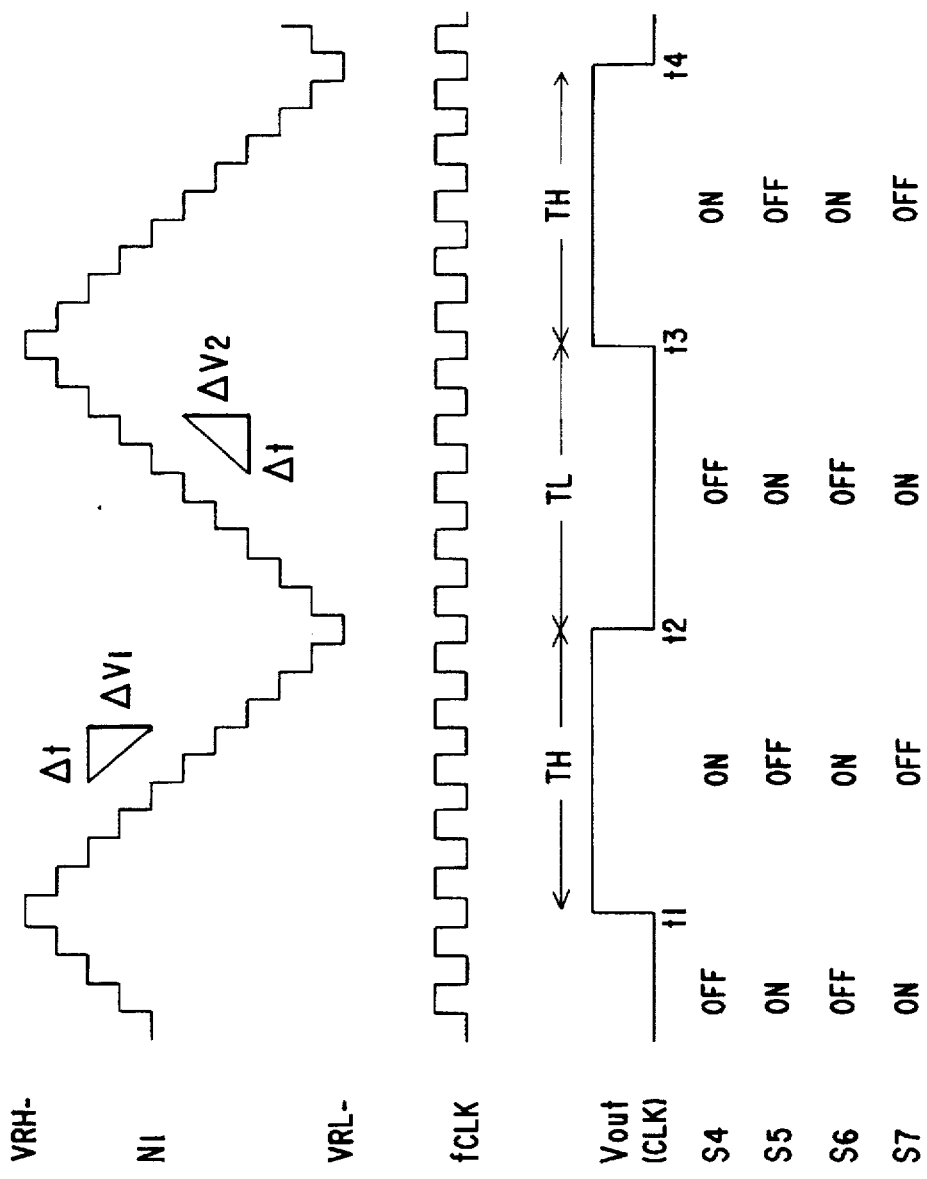
FIG. 3 is a diagram showing the waveforms of signals in the voltage-controlled oscillator shown in FIG. 2, as related to the turning on and off of various switches thereof.

FIG. 3 shows the waveforms of signals in the voltage-controlled oscillator shown in FIG. 2, as related 10 to the turning on and off of the switches S4–S7 thereof. Basically, the switches S4–S7 are shown as being turned on when a control signal applied thereto is of an H (high) level and turn off when the control signal is of an L (low) level. However, the relationship between the H and L' levels of the control signal and the turning on and off to the switches S4–S7 may be changed as desired.

The voltage-controlled oscillator shown in FIG. 2 basically operates such that the output signal from the operational amplifier AMP1 at the node N1 increases or decreases between the constant voltages VRH, VRL depending on whether the switches S4, S5 are turned on or off, and the voltage at the node N1 and the constant voltage VRH or VRL are compared with each other, generating a clock signal Vout (CLK) which is of either an H or L level. The speed at which the voltage at the node N1 increases or decreases, i.e., the gradient of the voltage at the node N1, depends on the magnitude of the input voltage Vin. Therefore, the voltage-controlled oscillator generates a clock signal Vout having a frequency depending on the input voltage Vin.

Overall operation of the voltage-controlled oscillator shown in FIG. 2 will be described below.

The first and second switched capacitor filters SCF1, SCF2 have respective equivalent positive and negative resistances as described in detail later on. In order to explain overall operation of the voltage-controlled oscillator, it is assumed that the first and second switched capacitor filters SCF1, SCF2 are regarded as equivalent resistors R1, R2, respectively (see FIGS. 4 and 5).

Figure 4:
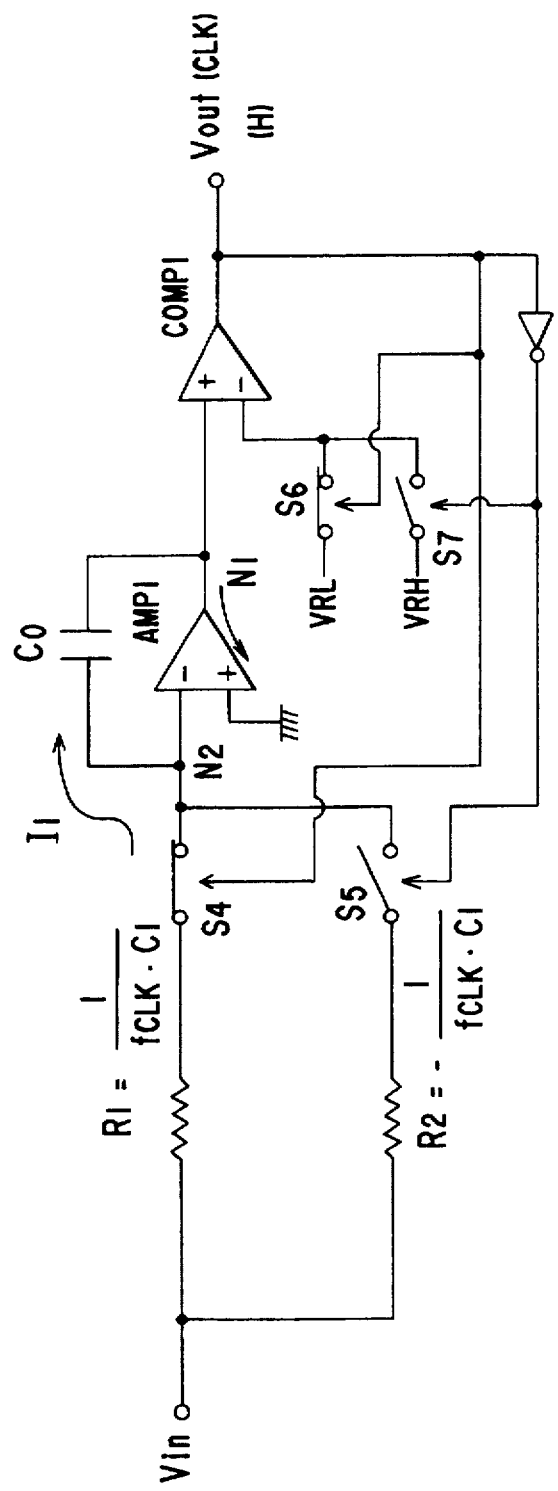
FIG. 4 is an equivalent circuit diagram illustrative of how the voltage-controlled oscillator shown in FIG. 2 operates at the time an output signal Vout thereof is in an H (high) level period TH.
Figure 5:
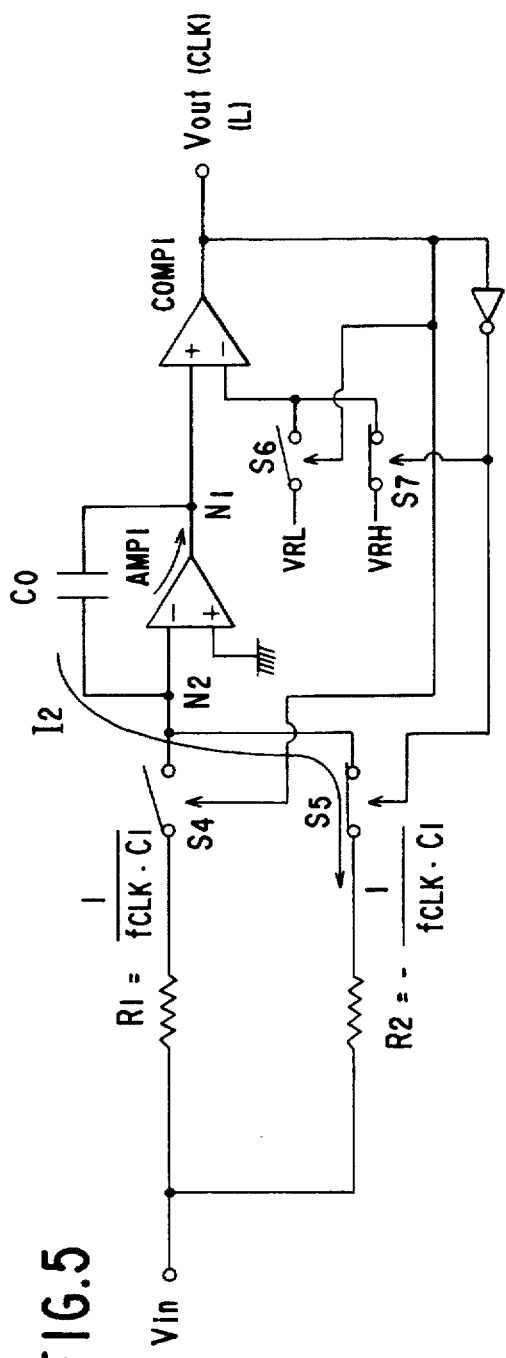
FIG. 5 is an equivalent circuit diagram illustrative of how the voltage-controlled oscillator shown in FIG. 2 operates at the time an output signal Vout thereof is in an L (low) level period TL.

FIGS. 4 and 5 are equivalent circuit diagrams illustrative of how the voltage-controlled oscillator shown in FIG. 2 operates. FIG. 4 shows operation of the voltage-controlled oscillator at the time an output signal Vout thereof is in an H level period TH, and FIG. 5 shows operation of the voltage-controlled oscillator at the time an output signal Vout thereof is in an L level period TL. In the period TH, the switch S4 is turned on and the switch S5 is turned off. In the period TL, the switch S4 is turned off and the switch S5 is turned on.

Since the switch S4 is turned on in the period TH, the input voltage Vin is applied to charge the capacitor C0 through the equivalent resistor R1 for thereby increasing the potential at the node N2 as indicated by a current I1 in FIG. 4. However, because the non-inverting input terminal of the operational amplifier AMP1 is grounded, the operational amplifier AMP1 operates to keep the node 2 connected to the inverting terminal thereof at the ground potential. As a result, the potential at the node N1 of the output terminal of the operational amplifier AMP1 is lowered, and hence the potential of the electrode of the capacitor C0 which is connected to the node N1 is lowered, making it possible to charge the capacitor C0.

The potential at the node N1 is continuously lowered until it reaches the lower constant voltage VRL that is applied to the negative input terminal of the comparator COMP1. When the potential at the node N1 reaches the constant voltage VRL, the output voltage Vout from the comparator COMP1 changes to an L level, whereupon the switch S4 is turned off and the switch S5 is turned on. At the same time, the higher constant voltage VRH is applied to the negative input terminal of the comparator COMP1.

In the period TL, since the switch S5 is turned on, the capacitor C0 is discharged through the equivalent resistor R2 as indicated by a current I2 in FIG. 5 for thereby lowering the potential at the node N2. However, because the non-inverting input terminal of the operational amplifier AMP1 is grounded, the operational amplifier AMP1 operates to keep the node 2 connected to the inverting terminal thereof at the ground potential. As a result, the potential at the node N1 of the output terminal of the operational amplifier AMP1 is increased, and hence the potential of the electrode of the capacitor C0 which is connected to the node N1 is increased, making it possible to discharge the capacitor C0.

The potential at the node N1 is continuously increased until it reaches the higher constant voltage VRH that is applied to the negative input terminal of the comparator COMP1. When the potential at the node N1 reaches the constant voltage VRH, the output voltage Vout from the comparator COMP1 changes to an H level, whereupon the switch S5 is turned off and the switch S4 is turned on. At the same time, the lower constant voltage VRL is applied to the negative input terminal of the comparator COMP1.

By thus switching the switches S4, S5, S6, S7 with the output voltage Vout, the potential at the node N1 can be lowered or increased at a speed or gradient depending on the input voltage Vin and the equivalent resistors R1, R2 of the first and second switched capacitor filters SCF1, SCF2. The gradient at which the potential at the node N1 is lowered or increased can be calculated using the equivalent resistors R1, R2 as follows:

In the period TH, the capacitor C0 is charged by the current I1 as shown in FIG. 4. If a charge stored in the capacitor C0 is indicated by ΔQ, then it is calculated as follows:

$$\Delta Q = C0 \times \Delta V1 = I1 \times \Delta t.$$

The current I1 is given by:

$$I1 = Vin/R1.$$

From the above two equations, the ratio of ΔV1 and Δt is expressed as follows:

$$\Delta V1/\Delta t = Vin/(C0 \times R1).$$

Similarly, in the period TL, the capacitor C0 is discharged by the current I2 as shown in FIG. 5. If a charge discharged from the capacitor C0 is indicated by ΔQ, then it is calculated as follows:

$$\Delta Q = C0 \times \Delta V2 = I2 \times \Delta t.$$

The current I2 is given by:

$$I2 = Vin/R2.$$

From the above two equations, the ratio of ΔV2 and Δt is expressed as follows:

$$\Delta V2/\Delta t = Vin/(C0 \times R2). \quad (2)$$

Operation of the switched capacitor filters SCF1, SCF2 will be described below.

Figure 6:
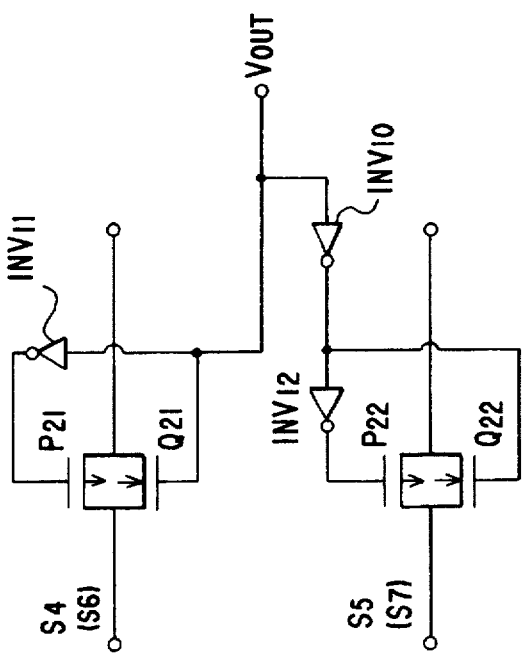
FIG. 6 is a circuit diagram of switches of the voltage-controlled oscillator shown in FIG. 2.

FIG. 6 shows in specific detail the switches S4, S5 of the voltage-controlled oscillator shown in FIG. 2. The switches S6, S7 are also of the same circuit arrangement as shown in FIG. 6. As shown in FIG. 6, the switch S4 comprises a CMOS circuit having a P-channel transistor P21 and an N-channel transistor Q21, and the switch S5 comprises a CMOS circuit having a P-channel transistor P22 and an N-channel transistor Q22. The transistors are controlled by the output voltage Vout through inverters INV10, INV11, INV12. The transistors are turned on when a control signal applied to the switches is of an H level and turn off when the control signal is of an L level.

Figure 7:
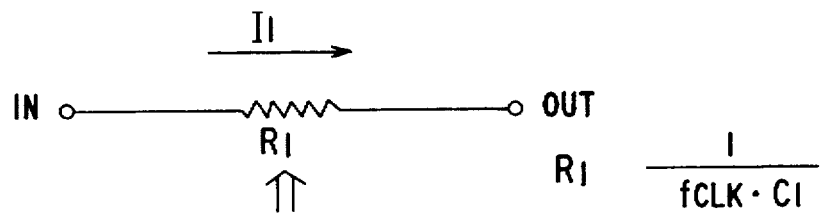
FIG. 7 is a circuit diagram of a first switched capacitor filter of the voltage-controlled oscillator shown in FIG. 2.
Figure 7:
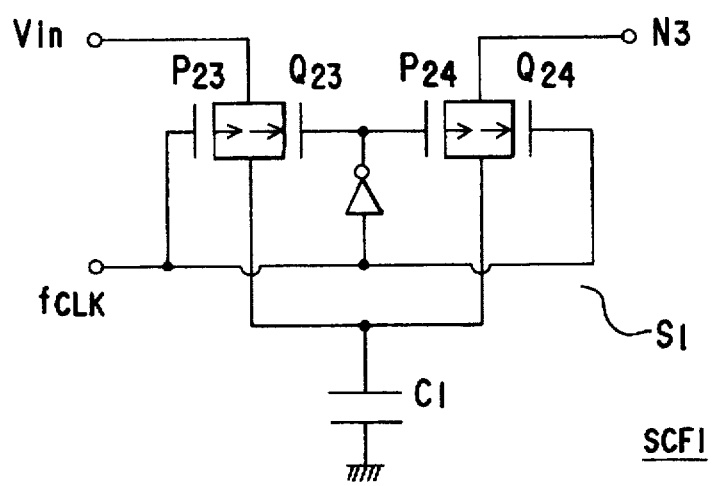

FIG. 7 shows in specific detail the first switched capacitor filter SCF1. The switch S1 of the first switched capacitor filter SCF1 comprises a CMOS switch having a P-channel transistor P23 and an N-channel transistor Q23, and a CMOS switch having a P-channel transistor P24 and an N-channel transistor Q24. The CMOS switches are alternately turned on and off by the control clock signal $F_{CLK}$.

Figure 8A:
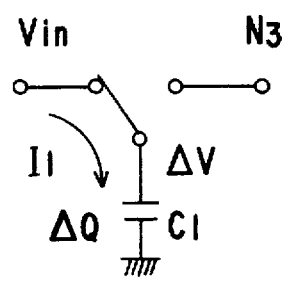
FIGS. 8A and 8B are equivalent circuit diagrams illustrative of how the first switched capacitor filter shown in FIG. 7 operates.
Figure 8B:
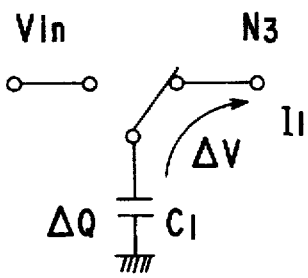

FIGS. 8A and 8B illustrate how the first switched capacitor filter SCF1 operates. The control clock signal $f_{CLK}$ is of an L level in FIG. 8A, and of an H level in FIG. 8B. In FIG. 8A, the input voltage Vin is applied directly to the capacitor C1 which is charged by the current I1 up to ΔV, for example, in a period Δt in which the control clock signal $f_{CLK}$ is of an L level. In FIG. 8B, the charge ΔQ stored in the capacitor C1 is discharged to a node N3 which is connected to the switch S4. The charge ΔQ and the control clock signal $f_{CLK}$ are expressed as follows:

$$\Delta Q = C1 \times \Delta V = I1 \times \Delta t,$$

$$f_{CLK} = 1/\Delta t.$$

From the above equations, the ratio of ΔV and I1 is given by:

$$\Delta V/I1 = 1/(f_{CLK} \times C1).$$

Therefore, since the equivalent resistor R1 of the first switched capacitor filter SCF1 is expressed by R1=ΔV/I1, as shown in FIG. 7, the equivalent resistor R1 is represented by:

$$R1 = 1/(F_{CLK} \times C1). \quad (3)$$

The first switched capacitor filter SCF1 operates equivalently as if to pump the stored charge through the capacitor C1 to the node N3.

When the equation (3) is substituted in the equation (1), the following equation is obtained:

$$\Delta V1/\Delta t = Vin/(C0 \times R1) = (Vin \times f_{CLK} \times C1)/C0.$$

In FIG. 3, the period TH in which the output voltage Vout is of an H level is given by:

$$TH = (VRH - VRL) \times \Delta t/\Delta V1.$$

Since the frequency $f_1$ of the output voltage Vout is proportional to the reciprocal of the period TH, it is expressed by:

$$f_1 \propto \frac{1}{TH} = \frac{\Delta V1}{(VRH - VRL)\Delta t} \quad (4)$$
$$= \frac{Vin \times f_{CLK} \times C1}{(VRH - VRL) \times C0}$$

Figure 9:
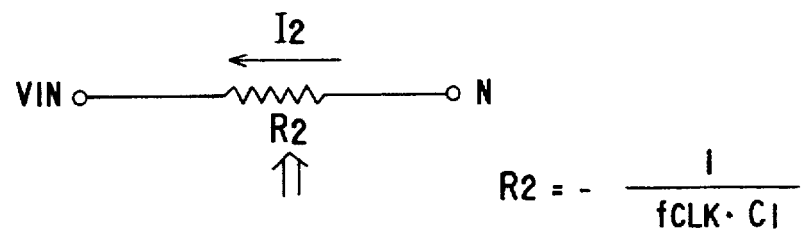
FIG. 9 is a circuit diagram of a second switched capacitor filter of the voltage-controlled oscillator shown in FIG. 2.
Figure 9:
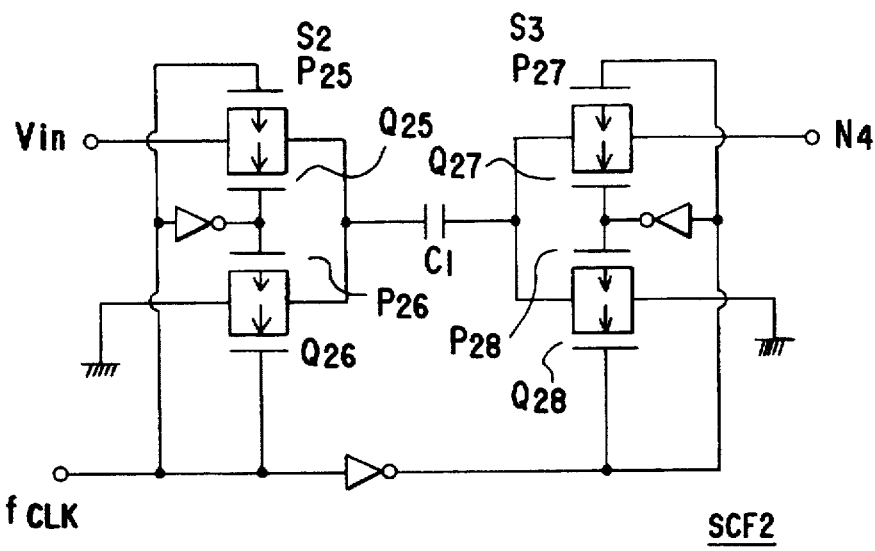

FIG. 9 shows in specific detail the second switched capacitor filter SCF2. The switch S2 of the second switched capacitor filter SCF2 comprises a CMOS switch having a P-channel transistor P25 and an N-channel transistor Q25, a CMOS switch having a P-channel transistor P26 and an N-channel transistor Q26, a CMOS switch having a P-channel transistor P27 and an N-channel transistor Q27, a CMOS switch having a P-channel transistor P28 and an N-channel transistor Q28. The CMOS switches have respective gate electrodes controlled by the control clock signal $F_{CLK}$.

Figure 10A:
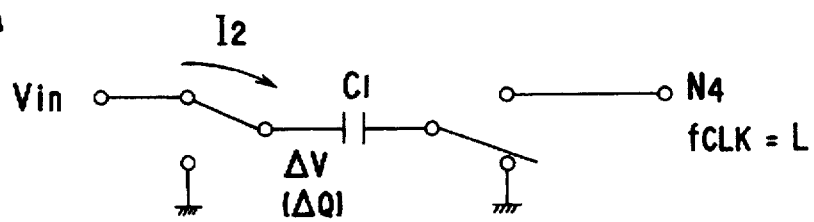
FIGS. 10A and 10B are equivalent circuit diagrams illustrative of how the second switched capacitor filter shown in FIG. 9 operates.
Figure 10B:
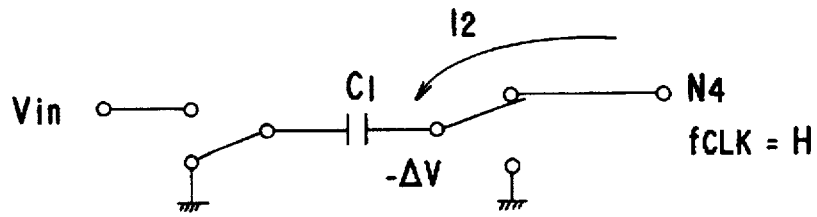

FIGS. 10A and 10B illustrate how the second switched capacitor filter SCF2 operates. When the control clock signal $F_{CLK}$ is of an L level, as shown in FIG. 10A, the input voltage Vin is applied to the capacitor C1 to charge itself with the current I1 up to ΔV. When the control clock signal $f_{CLK}$ changes to an H level, since one electrode of the capacitor C1 is grounded, as shown in FIG. 10B, the other electrode thereof is kept at a potential −ΔV, charging the capacitor C1 with the current I2 from a node N4 which is connected to the switch S5. The second switched capacitor filter SCF2 operates equivalently as if to pump the stored charge from the node N4 to the input terminal to which the input voltage Vin is applied.

The charge ΔQ and the control clock signal $F_{CLK}$ are expressed as follows:

$$\Delta Q = C1 \times \Delta V = I2 \times \Delta t,$$

$$f_{CLK} = 1/\Delta t.$$

From the above equations, the ratio of ΔV and I2 is given by:

$$\Delta V/I2 = 1/(f_{CLK} \times C1).$$

Therefore, since the equivalent resistor R2 of the second switched capacitor filter SCF2 is expressed by R2=−V/I2, as shown in FIG. 9, the equivalent resistor R2 is represented by:

$$R2 = -1/(f_{CLK} \times C1) \quad (5)$$

When the equation (5) is substituted in the equation (2), the following equation is obtained:

$$\Delta V2/\Delta t = Vin/(C0 \times R2) = -(Vin \times f_{CLK} \times C1)/C0.$$

In FIG. 3, the period TL in which the output voltage Vout is of an L level is given by:

$$TL = (VRH - VRL) \times \Delta t / \Delta V2.$$

Since the frequency $f_1$ of the output voltage Vout is proportional to the reciprocal of the period TL, it is expressed by:

$$f_2 \propto \frac{1}{TL} = \frac{\Delta V2}{(VRH - VRL)\Delta t} \quad (6)$$
$$= \frac{Vin \times f_{CLK} \times C1}{(VRH - VRL) \times C0}$$

The equation (6) is the same as the equation (4) described above. This is because the switched capacitor filters SCF1, SCF2 include the same capacitor C1.

As can be understood from the equations (4), (6), the frequency f of the output voltage Vout is proportional to the value of the input voltage Vin, and determined by the constant voltages VRH, VRL and the ratio of the values of the capacitors (C1/C0). The control clock signal $f_{CLK}$ and the constant voltages VRH, VRL can be made free of variations due to the fabrication process by the circuit arrangement. While each of the values of the capacitors C1, C0 is subject to variations due to the fabrication process in view of the relationship:

$$C = \epsilon S/d \text{ ($\epsilon$: dielectric constant, S: area, d: film thickness),}$$

the ratio of C1/C0 cancels out variations of the values of the capacitors C1, C0 due to the fabrication process, it is possible to make the frequency of a clock signal produced by the voltage-controlled oscillator free of variations due to the fabrication process.

Figure 11:
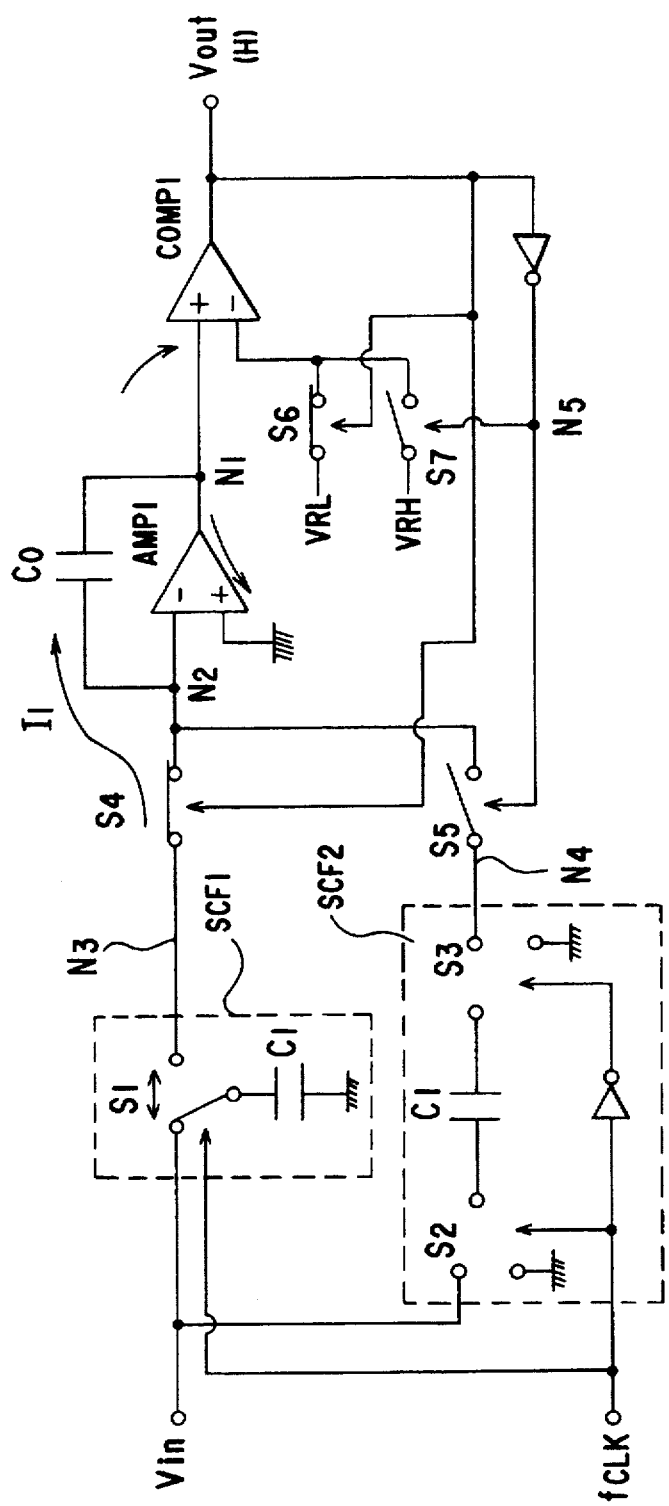
FIG. 11 is an equivalent circuit diagram of the voltage-controlled oscillator shown in FIG. 2 at the time an output signal Vout thereof is in an H (high) level period TH.
Figure 12:
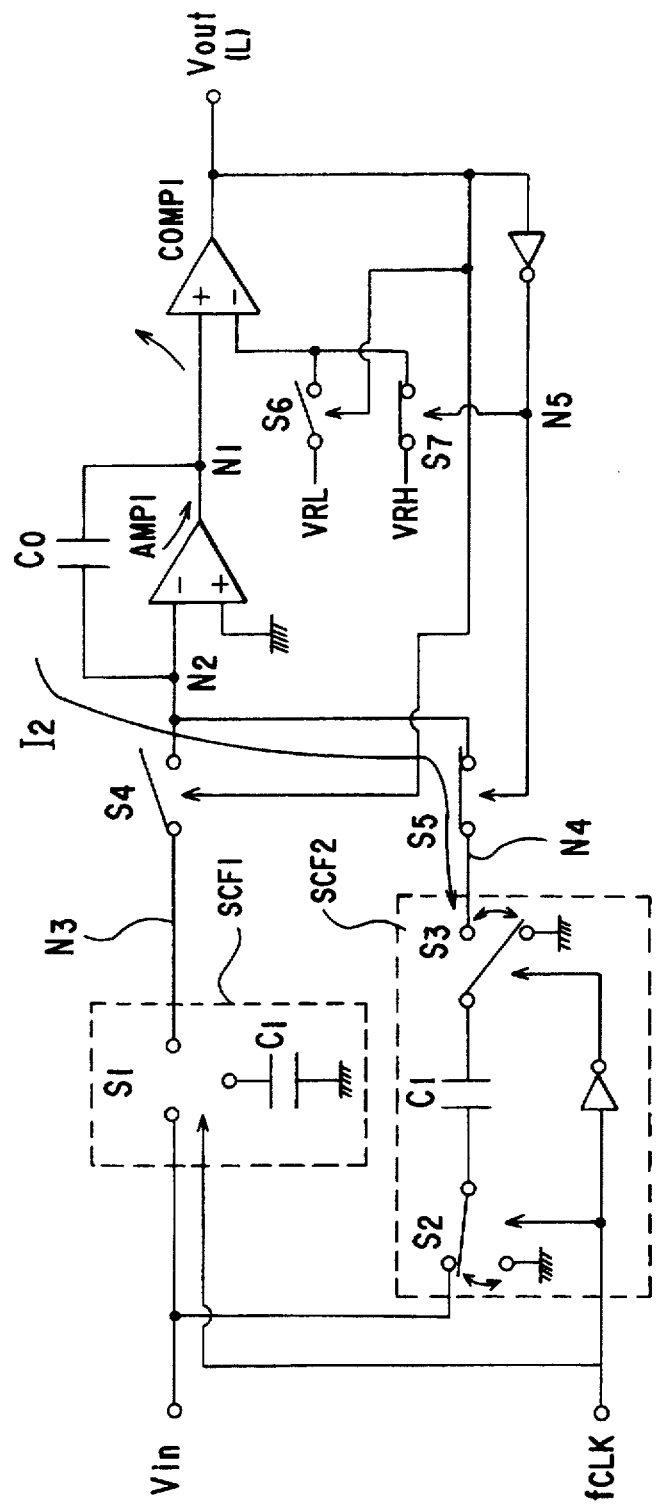
FIG. 12 is an equivalent circuit diagram of the voltage-controlled oscillator shown in FIG. 2 at the time an output signal Vout thereof is in an L (low) level period TL.

FIG. 11 shows an equivalent circuit of the voltage-controlled oscillator shown in FIG. 2 at the time the output signal Vout thereof is in an H level period TH, and FIG. 12 shows an equivalent circuit of the voltage-controlled oscillator shown in FIG. 2 at the time the output signal Vout is in an L level period TL.

In the period TH, the switches S4, S6 are turned on as shown in FIG. 11 just as they are turned on as shown in FIG. 4. As can be seen from the above description of the operation of the first switched capacitor filter SCF1, the first switched capacitor filter SCF1 operates to pump the stored charge depending on the input voltage Vin to the node N3 in synchronism with the control clock signal $f_{CLK}$. As a consequence, the current I1 flows to charge the capacitor C0. However, because the non-inverting input terminal of the operational amplifier AMP1 is grounded, the operational amplifier AMP1 operates for the node N2 to keep the ground potential of the non-inverting terminal. As a result, the potential at the node N1 of the output terminal of the operational amplifier AMP1 is lowered.

As shown in FIG. 3, in the period TH, the potential at the N1 is lowered stepwise in synchronism with the control clock signal $f_{CLK}$ until it reaches the lower constant voltage VRL which is applied to the negative input terminal of the comparator COMP1. When the potential at the node N1 reaches the lower constant voltage VRL, the output voltage Vout switches to an L level at times t2, t4.

In the period TL, the switches S5, S7 are turned on as shown in FIG. 12 just as they are turned on as shown in FIG. 5. As can be seen from the above description of the operation of the second switched capacitor filter SCF2, the second switched capacitor filter SCF2 operates to pump the stored charge depending on the input voltage Vin from the node N4 in synchronism with the control clock signal $f_{CLK}$. As a consequence, the current I2 flows to discharge the capacitor C0. However, because the non-inverting input terminal of the operational amplifier AMP1 is grounded, the operational amplifier AMP1 operates for the node N2 to keep the ground potential of the non-inverting terminal. As a result, the potential at the node N1 of the output terminal of the operational amplifier AMP1 is increased.

As shown in FIG. 3, in the period TL, the potential at the node N1 is increased stepwise in synchronism with the control clock signal $f_{CLK}$ until it reaches the higher constant voltage VRH which is applied to the negative input terminal of the comparator COMP1. When the potential at the node N1 reaches the lower constant voltage VRH, the output voltage Vout switches to an L level at times t1, t3.

Figure 13:
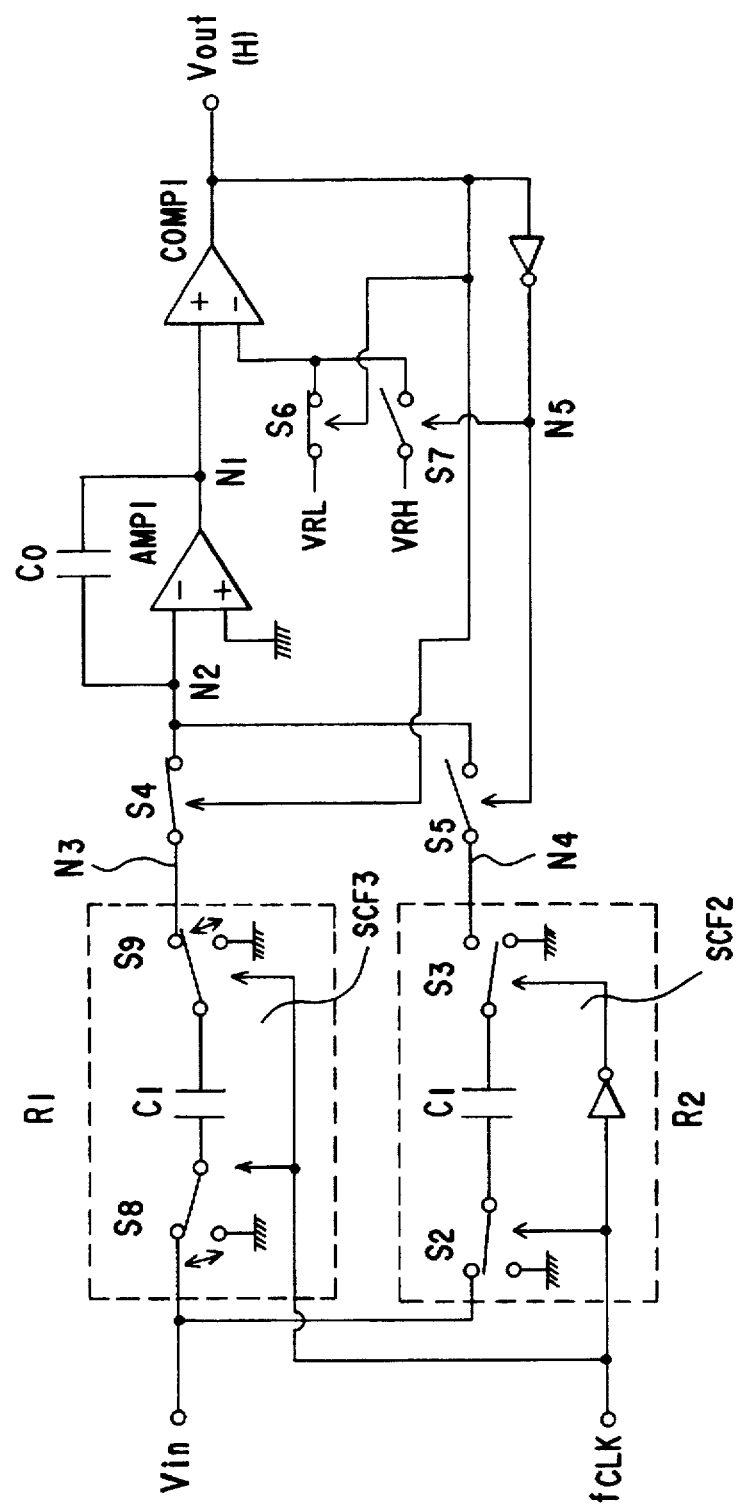
FIG. 13 is an equivalent circuit diagram of a modified voltage-controlled oscillator which differs from the voltage-controlled oscillator shown in FIG. 2 in that the first switched capacitor filter is replaced with another switched capacitor filter.

FIG. 13 shows an equivalent circuit of a modified voltage-controlled oscillator which differs from the voltage-controlled oscillator shown in FIG. 2 in that the first switched capacitor filter SCF1 is replaced with another switched capacitor filter SCF3. As shown in FIG. 13, the switched capacitor filter SCF3 comprises switches S8, S9 which can be turned on and off by the control clock signal $f_{CLK}$ and a capacitor C1. The switched capacitor filter SCF3 is similar to the second switched capacitor filter SCF2 except that the switches S8, S9 operate differently from the switches S2, S3.

FIG. 13 show states of the switches S4, S5, S6, S7 at the time the output voltage Vout of the voltage-controlled oscillator is of an H level. When the output voltage Vout is of an L level, the voltage-controlled oscillator operates in the same manner as shown in FIG. 12.

Figure 14:
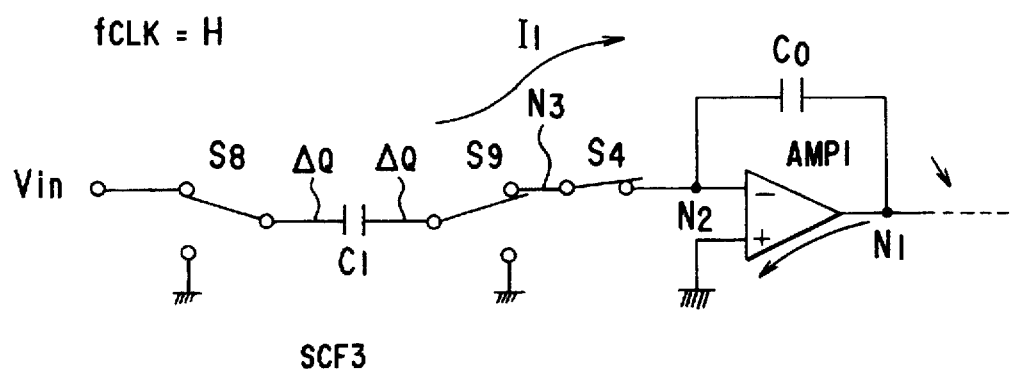
FIG. 14 is a circuit diagram illustrative of how the other switched capacitor filter including switches shown in FIG. 13 operates.
Figure 15:
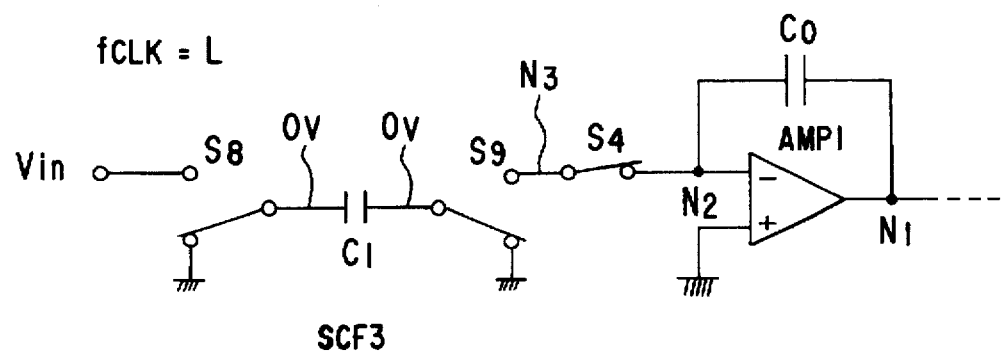
FIG. 15 is a circuit diagram illustrative of how the other switched capacitor filter including switches shown in FIG. 13 operates.

FIGS. 14 and 15 show operation of the switched capacitor filter SCF3 including the switches S8, S9. When the control clock signal $f_{CLK}$ is of an H level, the switch S8 is connected to the input terminal and the switch S9 is connected to the node N3 as shown in FIG. 14. As a result, the electrode of the capacitor C1 which is connected to the input terminal is charged up to $\Delta Q$, for example, by the input voltage Vin applied to the input terminal. The opposite electrode of the capacitor C1 is also held at a potential of $\Delta Q$ according to the principle of charge conservation. As a result, the electrode of the capacitor C0 which is connected to the node N2 tends to develop a voltage of $\Delta Q$. However, since the non-inverting input terminal of the operational amplifier AMP1 is grounded, the operational amplifier AMP1 operates to keep the electrode of the capacitor C0 which is connected to the node N2 at the ground potential, thus lowering the potential at the node N1.

When the control clock signal $f_{CLK}$ changes to an L level, as shown in FIG. 15, the switches S8, S9 are connected to ground, resetting the electrodes of the capacitor C1 to 0 V. When the control clock signal $f_{CLK}$ subsequently changes to an H level, the potential at the node N1 decreases depending on the voltage of $\Delta Q$ as shown in FIG. 14.

At this time, the voltage of $\Delta Q$ is the same as the charge to which the capacitor C1 is charged as described above with reference to FIGS. 7 and 8A, 8B. Therefore, the resistance of the equivalent resistor of the switched capacitor filter SCF3 is represented by:

$$R3 = 1/(f_{CLK} \times C1).$$

Therefore, the frequency f of the output voltage Vout of the modified voltage-controlled oscillator shown in FIG. 13 is also expressed by the equation (4) given above.

Figure 16:
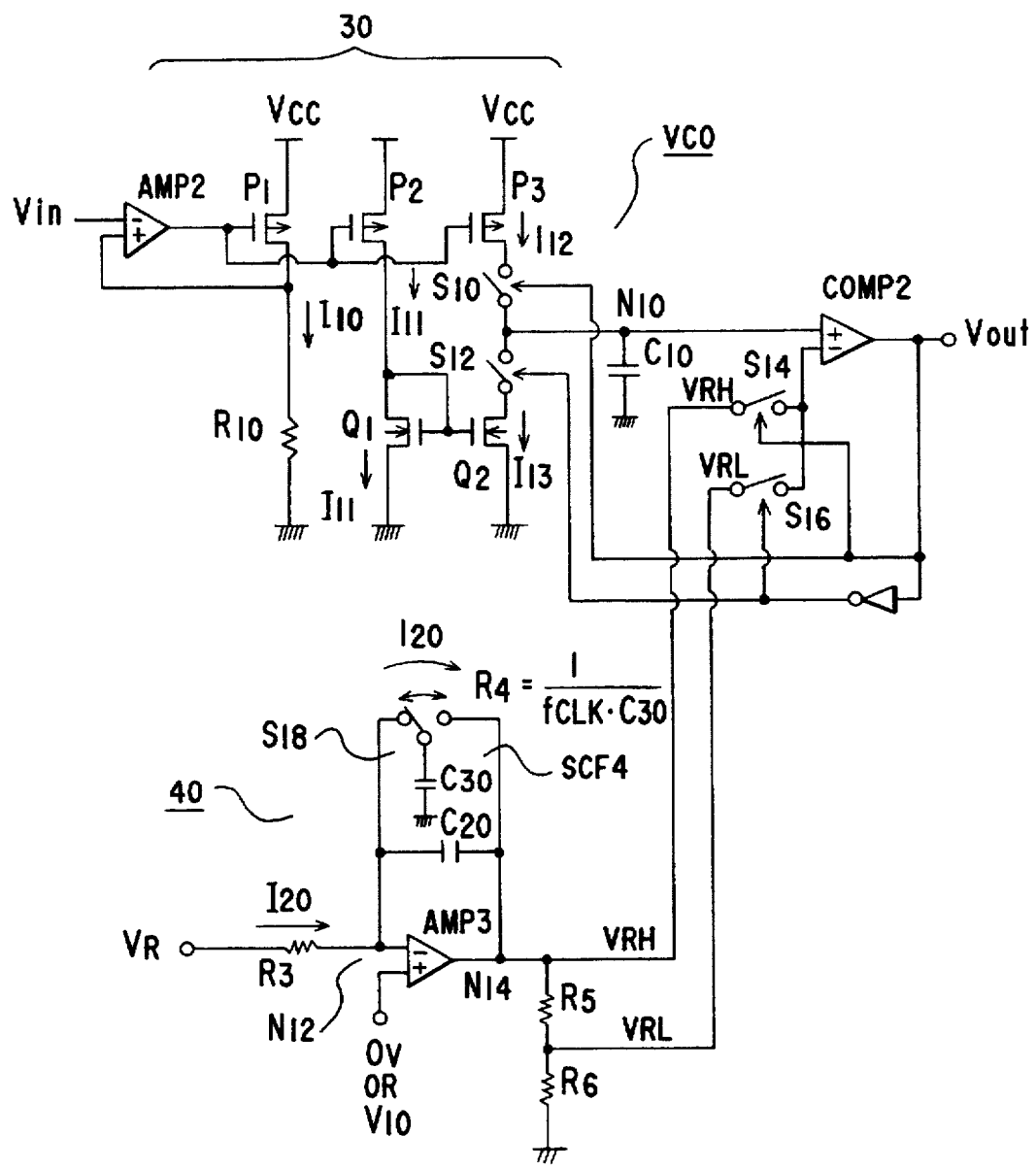
FIG. 16 is a circuit diagram of a voltage-controlled oscillator according to a modification of the present invention.

FIG. 16 shows a voltage-controlled oscillator according to a modification of the present invention. The voltage-controlled oscillator shown in FIGS. 2 or 13 is of the type which converts the input voltage Vin directly into the frequency (Vout). In the voltage-controlled oscillator shown in FIG. 16, a current I10 is generated depending on the input voltage Vin, a capacitor C10 is charged and discharged by the current I10, and a varying potential at a node N10 connected to the capacitor C10 is compared with the constant voltages VRH, VRL by a comparator COMP2 for conversion into a frequency (Vout).

The voltage-controlled oscillator shown in FIG. 16 includes a voltage-to-current converter 30 comprising an operational amplifier AMP2, P-channel transistors P1, P2, P3, N-channel transistors Q1, Q2, a resistor R10, and switches S10, S12. The P-channel transistors P1, P2, P3 have respective gates connected to the output terminal of the operational amplifier AMP2, and the P-channel transistor P1 has a drain connected to an inverting input terminal of the operational amplifier AMP2. The operational amplifier AMP2 controls a voltage represented by the product of the current I10 generated by the transistor P1 and a resistor R10 so as to be equal to the input voltage Vin. Specifically, if the input voltage Vin is higher, the operational amplifier AMP2 controls its output voltage to increase the current I10 to increase the level of the drain of the transistor P1. If the input voltage Vin is lower, the operational amplifier AMP2 controls its output voltage to reduce the current I10 to reduce the level of the drain of the transistor P1. Therefore, the operational amplifier AMP2 controls its output voltage to generate the current I10 depending on the magnitude of the input voltage Vin.

Since the output terminal of the operational amplifier AMP2 is connected to the other transistors P2, P3, currents I12, I13 generated by the other transistors P2, P3 are also controlled into magnitudes proportional to the input voltage Vin. If the transistors P1, P2, P3 have equal dimensions, then all the currents I10, I11, I12 are equal to each other.

Inasmuch as the transistors Q1, Q2 make up a current mirror, a current I13 is proportional to the current I11. If the transistors Q1, Q2 have equal dimensions, then all the currents I11, I13 are equal to each other.

Therefore, the voltage-to-current converter 30 generates the currents I12, I13 proportional to the magnitude of the input voltage Vin.

Figure 17:
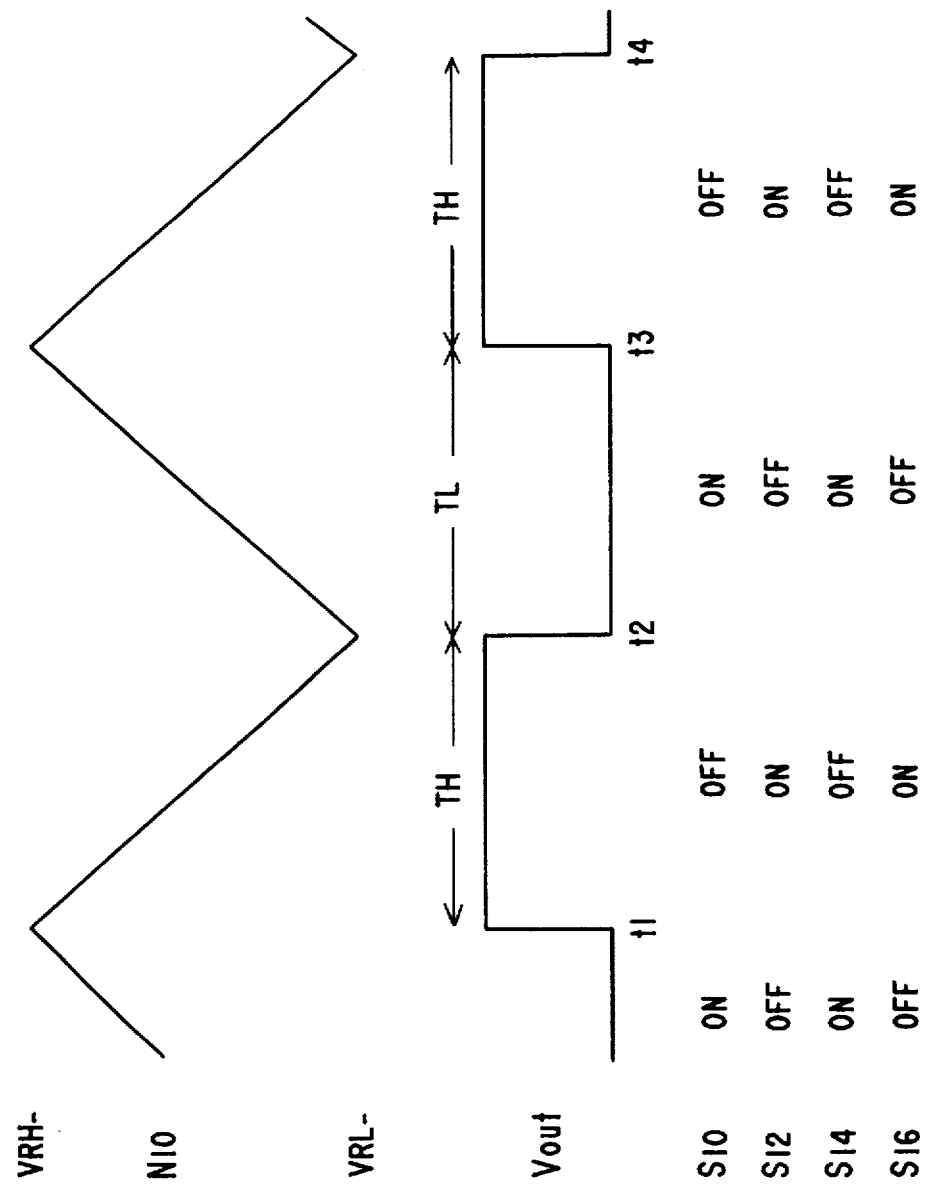
FIG. 17 is a diagram showing the waveforms of signals in the voltage-controlled oscillator shown in FIG. 16, as related to the turning on and off of various switches thereof.

FIG. 17 shows the waveforms of signals in the voltage-controlled oscillator shown in FIG. 16, illustrating operation of the voltage-controlled oscillator. Switches S10, S12, S14, S16 shown in FIG. 16 are controlled by the output voltage Vout. When the output voltage Vout is of an L level, the switch S10 is turned on, charging the capacitor C10 thereby to increase the potential at the node N10. When the potential at the node N10 reaches the constant voltage VRH, the output voltage Vout from the comparator COMP2 changes to an H level, turning on the switches S12, S14. The capacitor C10 is then discharged by the current I13, and the potential at the node N10 is lowered. When the potential at the node N10 reaches the constant voltage VRL, the output voltage Vout from the comparator COMP2 changes to an L level.

Because the charging current I12 and the discharging current I13 are of respective values proportional to the input voltage Vin, the speed at which the capacitor C10 is charged and discharged is proportional to the value of the input voltage Vin, and its frequency is of a value controlled by the input voltage Vin.

In the period TH shown in FIG. 17, since the capacitor C10 is discharged by the current I13, the ratio of $\Delta V$ and $\Delta t$ is expressed as follows:

$$\Delta V/\Delta t = I13/C10.$$

The period TH is given by:

$$TH \propto \frac{(VRH - VRL)}{\frac{\Delta V}{\Delta t}} = \frac{C10}{I13}(VRH - VRL).$$

Therefore, since its frequency f10 is f10=1/TH and the current I13 is $I13 \propto Vin/R10$, the frequency f10 is represented by:

$$f_{10} \propto \frac{I13}{(VRH - VRL) \times C10} \propto \frac{Vin}{(VRH - VRL) \times C10 \times R10} \tag{7}$$

The above relationship of the equation (7) is also satisfied when the capacitor C10 is charged.

As can be seen from the equation (7) above, the frequency f10 is subject to variations due to the fabrication process for the capacitor C10 and the resistor R10.

To eliminate such a drawback, the voltage-controlled oscillator shown in FIG. 16 has a constant-voltage generator 40 for generating the constant voltages VRH, VRL, which comprises a circuit incorporating a switched capacitor filter SCF4 to cancel out variations due to the fabrication process for the capacitor C10 and the resistor R10 as indicated by the equation (7).

The constant-voltage generator 40 comprises an operational amplifier AMP3, an input resistor R3, and a switched capacitor filter SCF4 as a feedback resistor R4. A constant voltage VR generated by a separate voltage source is applied through the resistor R3 and a node N12 to an inverting input terminal of the operational amplifier AMP3, and a voltage of 0 V or a constant voltage V10 is applied to a non-inverting input terminal of the operational amplifier AMP3. The operational amplifier AMP3 produces an output voltage at a node N14 as the higher constant voltage VRH, which is divided by resistors R5, R6 to produce a voltage as lower constant voltage VRL.

The resistors R3, R4 and the operational amplifier AMP3 make up an amplifier normally called an inverting amplifier whose amplification factor is represented by R4/R3. Specifically, the inverting amplifier controls the node N12 to keep the potential of 0 V, for example, at the non-inverting input terminal of the operational amplifier AMP3. Therefore, a current I20 flowing through the resistor R3 is expressed by:

$$I20 = VR/R3.$$

If the same current I20 flows through the feedback resistor R4 in the direction indicated by the arrow in FIG. 16, then the higher constant voltage VRH is represented by:

$$VRH = -I20 \times R4.$$

Inasmuch as the value of the equivalent resistor of the switched capacitor filter SCF4 is expressed by:

$$R4 = 1/(f_{CLK} \times C30), \text{ and}$$

the lower constant voltage VRL is expressed by $VRL = K \times VRH$, the difference VRH−VRL between the constant voltages VRH, VRL is represented as follows:

$$VRH - VRL = (K-1)VRH \quad (8)$$

$$= \frac{(1-K)VR}{f_{CLK} \times C30 \times R3}$$

From the equations (7) and (8), the frequency f10 is expressed by:

$$f_{10} \propto \frac{Vin \times f_{CLK} \times C30 \times R3}{(1-K)VR \times C10 \times R10} \quad (9)$$

As the product of a capacitance C and a resistance R is present in each of the denominator and numerator of the equation (9), differences between the capacitances and the resistances which are caused by variations of the fabrication process cancel out each other.

As described above, the constant-voltage generator incorporates an inverting amplifier whose amplification factor is represented by the ratio of the resistances of the input resistor R3 and the feedback resistor R4, with the feedback resistor R4 comprising the switched capacitor filter SCF4 and being represented by the reciprocal of the capacitance of the capacitor C30. In this manner, the CR component in the equation (7) can be canceled out.

The switched capacitor filter SCF4 in the constant-voltage generator 40 shown in FIG. 16 may be replaced with the switched capacitor filter SCF3 shown in FIGS. 13, 14, and 15 for similarly generating a frequency clock signal free of variations due to the fabrication process. The switched capacitor filter SCF3 has the same equivalent resistor as that of the switched capacitor filter SCF4, the switched capacitor filter generator SCF3 operates in the same manner as described above.

Figure 18:
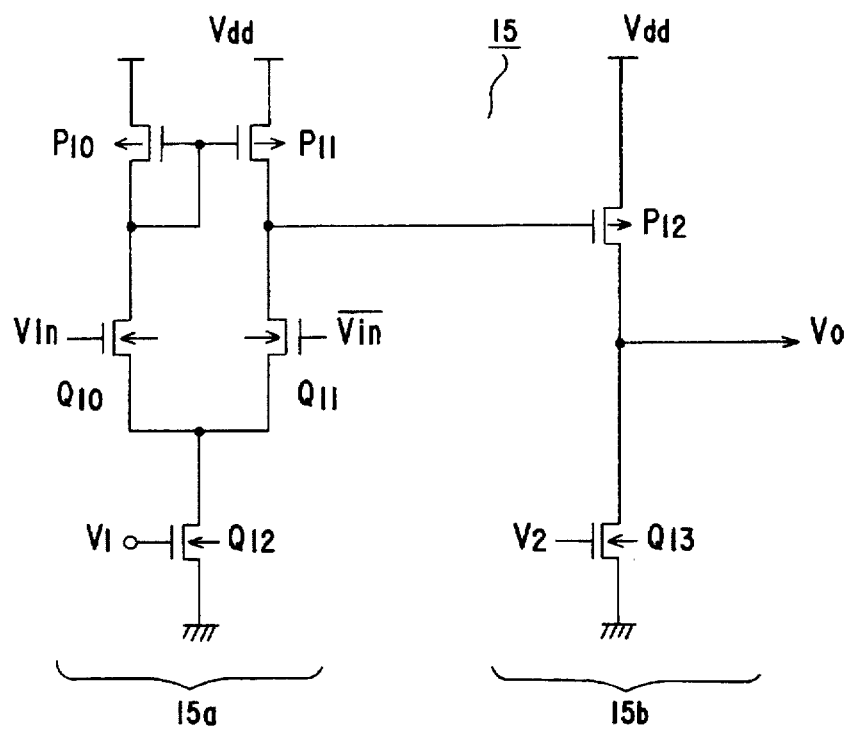
FIG. 18 is a circuit diagram of each of operational amplifiers in the voltage-controlled oscillators shown in FIGS. 2 and 16.

FIG. 18 shows each of the operational amplifiers AMP1, AMP2, AMP3. As shown in FIG. 18, each of the operational amplifiers AMP1, AMP2, AMP3 comprises a comparator 15a for comparing the input voltage Vin and an inverted value of the input voltage Vin, and an amplifier 15b for amplifying an output signal from the comparator 15a. The comparator 15a comprises a pair of load transistors P10, P11, which jointly make up a current mirror, a transistor Q12 serving as a constant-current source with a constant voltage V1 applied to a gate thereof, and a pair of transistors Q10, Q11 whose gates are supplied with the input voltage Vin and the inverted value thereof, respectively. The transistor Q11 has a drain connected to the gate of a P-channel transistor P12 whose drain is connected to an output terminal Vo. A transistor Q13 serves as a constant-current source to which a constant voltage V2 is applied.

When the input voltage Vin is reduced, the conductance of the transistor Q10 increases, and the conductance of the transistor Q11 decreases. Therefore, the potential at the drain of the transistor Q11 is lowered, and is inverted and amplified by the P-channel transistor P12, with a resulting increase in the output voltage from the output terminal Vo.

As a consequence, in the operational amplifier AMP2 shown in FIG. 16, when the output voltage from the output terminal Vo increases, the potential at the gate of the P-channel transistor P12 increases, reducing the current I10. As a result, the potential at the gate of the transistor Q11 to which the voltage drop across the resistor R10 as the inverted value of the input voltage/Vin also decreases. When the difference between the input voltage Vin and the inverted value/Vin thereof becomes nil, the operational amplifier operates stably. When the input voltage Vin is increased, the operational amplifier operates in a manner which is the reversal of the above process, increasing the current I10.

Figure 19:
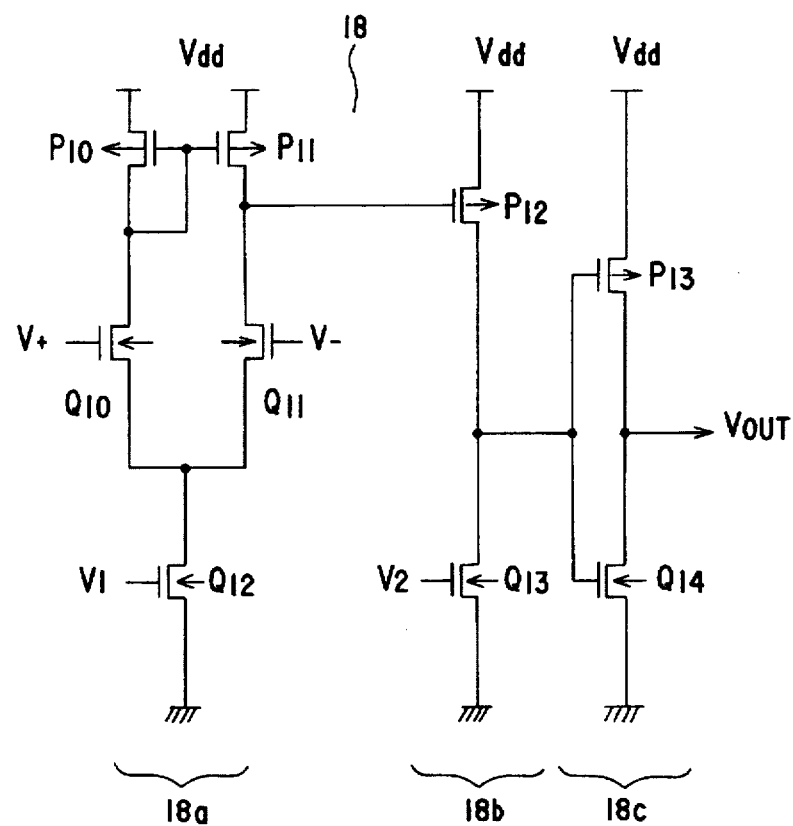
FIG. 19 is a circuit diagram of each of comparators in the voltage-controlled oscillators shown in FIGS. 2 and 16.

FIG. 19 shows each of the comparators COMP1, COMP2. As shown in FIG. 19, each of the comparators COMP1, COMP2 comprises an input comparator 18a, an amplifier 18b for amplifying an output signal from the input comparator 18a, and an output converter 18c for converting an output signal from the amplifier 18b into an H- or L-level digital signal. The input comparator 18a and the amplifier 18b are identical respectively to the comparator 15a and the amplifier 15b of the operational amplifier shown in FIG. 18. In the comparator, the amplifier 18b has an output terminal connected to an input terminal of a CMOS inverter, as the output converter 18c, which comprises a P-channel transistor P13 and an N-channel transistor Q14. An output voltage Vout from the output converter 18c switches between an H level or an L level each time the potential relationship 10 between input voltages V+ and V− applied to the input comparator 18a changes.

When the input voltage V+ is greater than the other input voltage V−, the conductance of the transistor Q10 becomes lower and the conductance of the transistor Q11 becomes higher. Therefore, the potential at the drain of the transistor Q11 is increased, and inverted and amplified by the P-channel transistor P12. The potential at the drain of the P-channel transistor P12 is lowered, producing the output voltage Vout which is of an H level. Therefore, when V+>V−, the output voltage Vout is of an H level. Conversely, when V+<V−, the output voltage Vout is of an L level.

The switched capacitor filters described above may be designed in any of various other circuit arrangements by one of ordinary skill in the art. Even in those possible circuit arrangements, the switched capacitor filter is controlled by a control clock signal, and the equivalent resistance thereof is represented by the reciprocal of the product of the capacitance and the frequency of the control clock signal to make the frequency of the output voltage from the voltage-controlled oscillator free of variations due to the fabrication process for the capacitor C and the resistor R.

Although certain preferred embodiments of the present invention have been shown and described in detail, it should be understood that various changes and modifications may be made therein without departing from the cope of the appended claims.

What is claimed is:

1. A voltage-controlled oscillator for generating an output clock signal having a frequency depending on the value of an input voltage applied thereto, comprising:

a first switched capacitor filter operatively connected to an input voltage terminal supplied with the input voltage, for switchingly operating in response to a control clock signal to supply a positive current depending on the input voltage;

a second switched capacitor filter operatively connected to said input voltage terminal, for switchingly operating in response to the control clock signal to supply a negative current depending on the input voltage;

an operational amplifier having an input terminal alternately connectable to said first switched capacitor filter and said second switched capacitor filter by a first switch which can be rendered conductive in synchronism with the output clock signal, and another input terminal for being supplied with a constant voltage, the arrangement being such that a potential at an output terminal of the operational amplifier is lowered when the operational, amplifier is supplied with the positive current through a feedback circuit which is provided between said input terminal and the output terminal, and a potential at the output terminal is increased when the operational amplifier is supplied with the negative current through said feedback circuit; and a comparator for comparing a potential at the output terminal (N1) of the operational amplifier alternately with a first constant voltage and a second constant voltage which can be switched in synchronism with said output clock signal, said second constant voltage being lower than said first constant voltage, therein to produce said output clock signal.

2. A voltage-controlled oscillator according to claim 1, wherein said first switched capacitor filter comprises a capacitor having an electrode connected to a constant-voltage terminal and another electrode connectable alternately to said input voltage terminal and said first switch through a second switch which is controlled by said control clock signal, and an equivalent resistor having a resistance depending on the reciprocal of the product of the capacitance of said capacitor and the frequency of said control clock signal.

3. A voltage-controlled oscillator according to claim 1, wherein said first switched capacitor filter comprises a capacitor having an electrode connectable alternately to said input voltage terminal and a constant-voltage terminal through a third switch which is controlled by said control clock signal and another electrode connectable alternately to said first switch and said constant-voltage terminal (GND) through a fourth switch controlled in phase with said third switch by said control clock signal, and an equivalent resistor having a resistance depending on the reciprocal of the product of the capacitance of said capacitor and the frequency of said control clock signal.

4. A voltage-controlled oscillator according to claim 1, wherein said second switched capacitor filter comprises a capacitor having an electrode connectable alternately to said input voltage terminal and a constant-voltage terminal through a fifth switch which is controlled by said control clock signal and another electrode connectable alternately to said first switch and said constant-voltage terminal through a sixth switch controlled in opposite phase with said fifth switch by said control clock signal, and an equivalent resistor having a resistance depending on the reciprocal of the product of the capacitance of said capacitor and the frequency of said control clock signal.

5. A voltage-controlled oscillator according to claim 1, wherein said comparator has an input terminal operatively connected to the output terminal of the operational amplifier and another input terminal for being supplied with said first constant voltage when the potential at the output terminal of the operational amplifier increases and with said second constant voltage when the potential at the output terminal of the operational amplifier decreases.

6. A phase-locked loop for generating an output signal in phase with an input signal, said output signal having a frequency which is a multiple of the frequency of the input signal, comprising:

a phase comparator for detecting a phase difference between the input signal and a comparison signal produced by dividing the frequency of the output signal by a predetermined number;

a voltage-controlled oscillator according to any of claims 1 through 4 for producing said output signal in response to an output voltage from said phase comparator; and a frequency divider for dividing the frequency of said output signal by said predetermined number.

7. A phase-locked loop for generating an output signal in phase with an input signal, said output signal having a frequency which is a multiple of the frequency of the input signal, comprising:

a phase comparator for detecting a phase difference between the input signal and a comparison signal produced by dividing the frequency of the output signal by a predetermined number;

a voltage-controlled oscillator according to claim 5 for producing said output signal in response to an output voltage from said phase comparator; and a frequency divider for dividing the frequency of said output signal by said predetermined number.

8. A voltage-controlled oscillator for generating an output clock signal having a frequency depending on the value of an input voltage applied thereto, comprising:

a voltage-to-current converter for generating a current depending on the input voltage which is supplied through an input voltage terminal;

a chargeable/dischargeable capacitor (C10) for being charged and discharged in synchronism with the output clock signal by a current generated by said voltage-to-current converter;

a comparator for comparing a voltage across said chargeable/dischargeable capacitor (C10) as it is charged and discharged alternately with a first constant voltage and a second constant voltage which can be switched in synchronism with said output clock signal, said second constant voltage being lower than said first constant voltage, therein to produce said output clock signal; and an operational amplifier having an input resistor connected to an input terminal thereof and a feed back resistor provided between said input terminal and an output terminal thereof;

said feed back resistor comprising a first switched capacitor filter switchingly controlled by said control clock signal.

9. A voltage-controlled oscillator according to claim 8, wherein said first switched capacitor filter comprises a capacitor having an electrode connected to a constant-voltage terminal and another electrode connectable alternately to said input terminal and said output terminal through a first switch which is controlled by said control clock signal, and an equivalent resistor having a resistance depending on the reciprocal of the product of the capacitance of said capacitor and the frequency of said control clock signal.

10. A voltage-controlled oscillator according to claim 8, wherein said first switched capacitor filter comprises a capacitor having an electrode connectable alternately to said input terminal and a constant-voltage terminal through a third switch which is controlled by said control clock signal and another electrode connectable alternately to said output terminal and said constant-voltage terminal through a second switch controlled in phase with said first switch by said control clock signal, and an equivalent resistor having a resistance depending on the reciprocal of the product of the capacitance of said capacitor and the frequency of said control clock signal.

11. A voltage-controlled oscillator according to claim 8, wherein said voltage-to-current converter comprises:

a first constant-current source for generating a constant current depending on said input voltage;

a second constant-current source for generating a constant current depending on said input voltage;

a first switch connected between said first constant-current source and a terminal of said chargeable/dischargeable capacitor, for being turned on and off by the output clock signal produced by said comparator; and an second switch connected between said second constant-current source and a terminal of said chargeable/dischargeable capacitor, for being turned on and off alternately with said first switch by the output clock signal produced by said comparator.

12. A phase-locked loop for generating an output signal in phase with an input signal, said output signal having a frequency which is a multiple of the frequency of the input signal, comprising:

a phase comparator for detecting a phase difference between the input signal and a comparison signal produced by dividing the frequency of the output signal by a predetermined number;

a voltage-controlled oscillator according to any of claims 6 through 9 for producing said output signal in response to an output voltage from said phase comparator; and a frequency divider for dividing the frequency of said output signal by said predetermined number.

* * * * *